United States Patent
Cho et al.

(10) Patent No.: US 9,218,074 B2
(45) Date of Patent: Dec. 22, 2015

(54) GATE DRIVE CIRCUIT AND DISPLAY DEVICE HAVING THE GATE DRIVE CIRCUIT

(71) Applicant: SAMSUNG DISPLAY CO., LTD., Yongin, Gyeonggi-Do (KR)

(72) Inventors: Duc-Han Cho, Incheon (KR); Kang-Nam Kim, Ulsan (KR); Jae-Hoon Lee, Geumcheong-Gu (KR); You-Mee Hyun, Anyang-Si (KR); Jong-Woong Chang, Asan-Si (KR); Yun Heo, Gunpo-Si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 278 days.

(21) Appl. No.: 13/719,488

(22) Filed: Dec. 19, 2012

(65) Prior Publication Data
US 2013/0335392 A1    Dec. 19, 2013

(30) Foreign Application Priority Data
Jun. 19, 2012    (KR) .................. 10-2012-0065685

(51) Int. Cl.
| G09G 5/00 | (2006.01) |
| G06F 3/038 | (2013.01) |
| H03K 3/00 | (2006.01) |
| G11C 19/28 | (2006.01) |
| G09G 3/36 | (2006.01) |

(52) U.S. Cl.
CPC .............. *G06F 3/038* (2013.01); *G09G 5/001* (2013.01); *G11C 19/28* (2013.01); *H03K 3/00* (2013.01); *G09G 3/3674* (2013.01); *G09G 2310/0286* (2013.01)

(58) Field of Classification Search
CPC ............ G06F 3/038; H03K 3/00; G09G 5/00; G09G 5/001; G09G 3/20
USPC ................................. 345/211, 204
See application file for complete search history.

(56) References Cited

U.S. PATENT DOCUMENTS

| 2010/0201668 A1* | 8/2010 | Ko et al. .................. 345/211 |
| 2012/0139883 A1* | 6/2012 | Lee et al. .................. 345/204 |
| 2013/0038587 A1* | 2/2013 | Song et al. ................ 345/211 |

* cited by examiner

*Primary Examiner* — Fred Tzeng
(74) *Attorney, Agent, or Firm* — F. Chau & Associates, LLC

(57) ABSTRACT

A gate drive circuit in which multiple stages are connected together one after each other. An n-th stage includes a pull-up part, a carry part, a pull-down part, a switching part, a first maintaining part and a second maintaining part. The pull-up part outputs a high voltage of a first clock signal. The carry part outputs a high voltage of the first clock signal. The pull-down part pulls-down the n-th gate signal into a first low voltage. The switching part outputs a first signal synchronized with the first clock signal during an interval other than a high voltage output interval of the n-th carry signal. The first maintaining part maintains the n-th gate signal at the first low voltage in response to the first signal. The second maintaining part maintains the n-th gate signal at the first low voltage in response to a second signal.

21 Claims, 10 Drawing Sheets

GATE DRIVE CIRCUIT AND DISPLAY DEVICE HAVING THE GATE DRIVE CIRCUIT

CROSS-REFERENCE TO RELATED APPLICATION

This application claims under 35 U.S.C. §119 priority to and the benefit of Korean Patent Application No. 10-2012-0065685, filed on Jun. 19, 2012 in the Korean Intellectual Property Office (KIPO), the entire contents of which are incorporated by reference herein.

BACKGROUND

1. Technical Field

The present disclosure relates to a gate drive circuit and a display device having the gate drive circuit, and more particularly, to a gate drive circuit for improving the driving reliability of the display device and a display device having the gate drive circuit.

2. Discussion of the Related Art

Recently, to decrease the total size of a panel module for a display and manufacturing costs of the panel module for the display, a gate drive circuit has been integrated on a peripheral area of a display substrate of an amorphous silicon gate (ASG) type.

Since the gate drive circuit generates a gate signal by selecting a clock signal having a continuously varied phase, noise is generated by the clock signal during non-driving time. Thus, various structures of the gate drive circuit have been developed so as to minimize noise.

For example, a maintaining part can maintain the gate signal into an off voltage in response to a high voltage of the clock signal inputted during non-driving time. However, the gate drive circuit does not have a structure which maintains the gate signal at an additional off voltage when a low voltage of the clock signal is applied, such that the gate signal is floated and driving defects caused by the floating reduce display quality.

SUMMARY

Exemplary embodiments of the present invention provide a gate drive circuit for improving the driving reliability of a display device.

Exemplary embodiments of the present invention also provide a display device having such a gate drive circuit.

According to an exemplary embodiment a gate drive circuit in which multiple stages are connected together one after each other, the stages configured to output a plurality of gate signals is provided. An n-th stage, 'n' being a natural number, includes: a pull-up part configured to output a high voltage of a first clock signal applied through a first clock terminal as a high voltage of an n-th gate signal, a carry part configured to output a high voltage of the first clock signal as a high voltage of an n-th carry signal, a pull-down part configured to pull-down the n-th gate signal into a first low voltage in response to a high voltage of a carry signal of an (n+1)-th stage, a switching part configured to output a first signal synchronized with the first clock signal during an interval other than a high voltage output interval of the n-th carry signal, a first maintaining part configured to maintain the n-th gate signal into the first low voltage in response to the first signal, and a second maintaining part configured to maintain the n-th gate signal into the first low voltage in response to a second signal having a phase different from that of the first signal.

The second signal may have a phase opposite to the first signal.

The second signal may be applied through a second clock terminal, and the second signal may be a second clock signal having a phase different from a phase of the first clock signal.

The second maintaining part may include: an eighteenth transistor having a control terminal connected to the second clock terminal, an input terminal configured to receive the n-th gate signal, and an output terminal configured to receive the first low voltage.

The pull-up part may include a first transistor and the pull-down part may include a second transistor. The eighteenth transistor may be disposed between the first transistor and the second transistor.

The gate drive circuit may further include a first connecting line connected to a control terminal of the eighteenth transistor of a first stage and the second clock terminal of a third stage, and a second connecting line connected to a control terminal of the eighteenth transistor of a second stage and the second clock terminal of a fourth stage, wherein the first connecting line and the second connecting line may be disposed on a gate metal layer, and a number of points may be overlapped with the first connecting line and a source metal layer is substantially equal to a number of points overlapped with the second connecting line and the source metal layer.

The second signal may be a third signal outputted from a switching part of another stage different from the n-th stage.

The third signal may be a signal outputted from a switching part of an (n−1)-th stage.

The second maintaining part may include an eighteenth transistor having a control terminal connected to an output part of a switching part of the (n−1)-th stage, an input terminal configured to receive the n-th gate signal and an output terminal configured to receive the first low voltage.

The pull-up part may include a first transistor and the pull-down part may include a second transistor, wherein the eighteenth transistor may be disposed between the first transistor and the second transistor.

The n-th stage may further include a discharging part configured to discharge a voltage of a control terminal of the pull-up part into a second low voltage in response to an (n+1)-th carry signal outputted from a carry part of an (n+1)-th stage.

The n-th stage may further include: a third maintaining part configured to maintain a voltage of a control terminal of the pull-up part into the second low voltage in response to a first signal outputted from the switching part, a fourth maintaining part configured to maintain a voltage of a control terminal of the switching part into the second low voltage in response to an (n−1)-th carry signal outputted from a carry part of an (n−1)-th stage, a fifth maintaining part configured to maintain a voltage of a control terminal of the pull-up part into the second low voltage in response to an (n+2)-th carry signal outputted from a carry part of an (n+2)-th stage, and a sixth maintaining part configured to maintain a voltage of a carry part of the n-th stage into the second low voltage in response to the (n+1)-th carry signal.

According to an exemplary embodiment, a display device is provided. A display panel includes a display area on which gate lines and source lines are formed and a peripheral area surrounding the display area. A source drive circuit is configured to output data signals to the source lines. A gate drive circuit is integrated on the peripheral area, in which multiple stages are connected together one after each other, the stages configured to output a plurality of gate signals to the gate lines. An n-th stage, 'n' being a natural number, includes: a pull-up part configured to output a high voltage of a first clock signal applied through a first clock terminal as a high voltage of an n-th gate signal, a carry part configured to output a high voltage of the first clock signal as a high voltage of an n-th carry signal, a pull-down part configured to pull-down the n-th gate signal into a first low voltage in response to a high voltage of a carry signal of an (n+1)-th stage, a switching part configured to output a first signal synchronized with the first clock signal during an interval except a high voltage output interval of the n-th carry signal, a first maintaining part configured to maintain the n-th gate signal at the first low voltage in response to the first signal, and a second maintaining part configured to maintain the n-th gate signal at the first low voltage in response to a second signal having a phase different from that of the first signal.

According to an exemplary embodiment, a gate drive circuit of a display device is provided. A first maintaining part is configured to maintain a gate signal at an off voltage in response to a high voltage of a clock signal applied to the gate drive circuit during a gate output off interval. A second maintaining part is configured to maintain the gate signal at the off voltage in response to a low voltage of the clock signal applied to the gate drive circuit during the gate output off interval.

BRIEF DESCRIPTION OF THE DRAWINGS

Exemplary embodiments of the present invention will now be described with reference to the accompanying drawings, in which.

DETAILED DESCRIPTION

Figure 1:
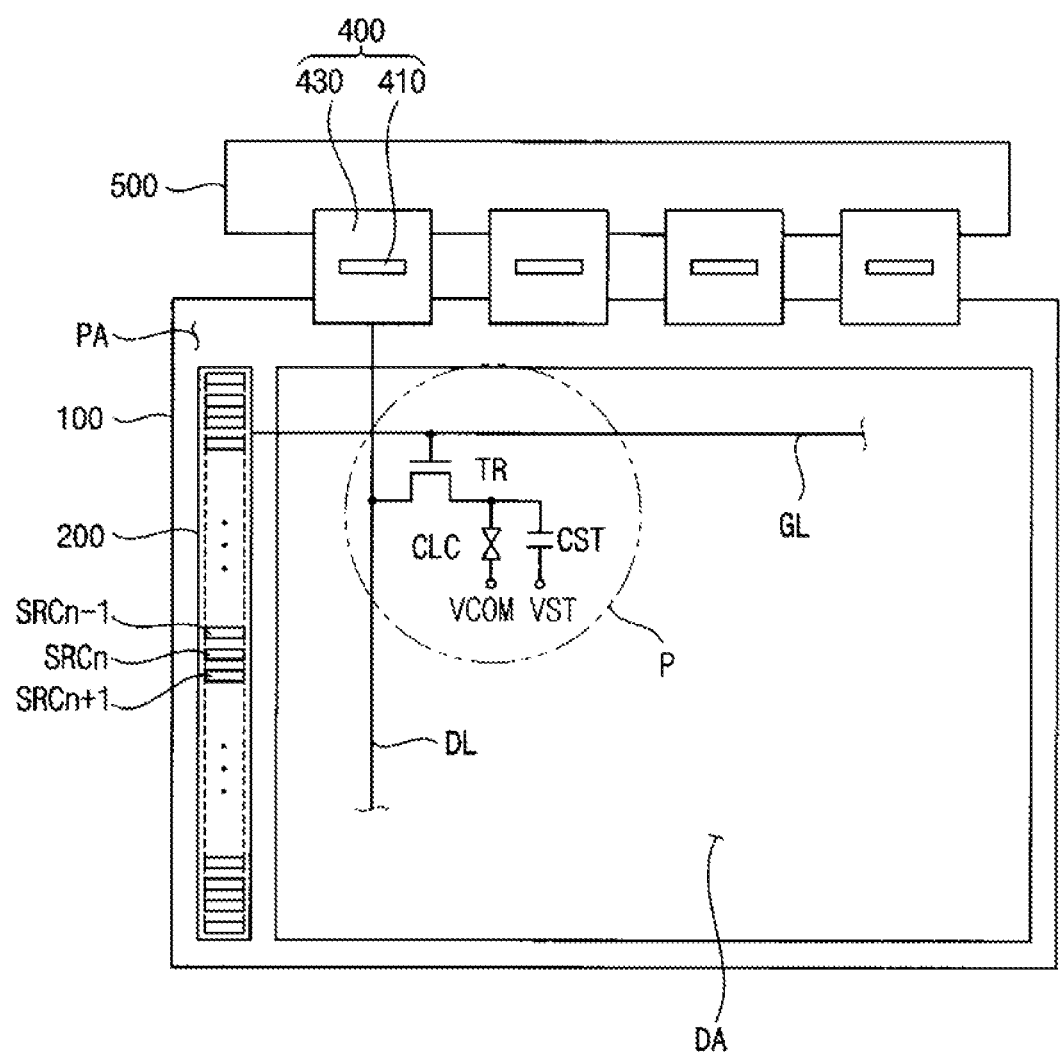
FIG. 1 is a plan view schematically showing a display device according to an exemplary embodiment of the present invention.

Referring now to FIG. 1, a display device includes a display panel 100, a gate drive circuit 200, a source drive circuit 400 and a printed circuit board 500.

The display panel 100 includes a display area DA and a peripheral area PA surrounding the display area DA. A plurality of gate lines GL, a plurality of data (source) lines DL and a plurality of pixel parts P are formed on the display area DA. Each of the pixel parts P includes a switching element TR electrically connected to the gate line GL and the data line DL, a liquid crystal capacitor CLC electrically connected to the switching element TR and a storage capacitor CST connected to the liquid crystal capacitor CLC in parallel.

The gate drive circuit 200 includes a shift register that sequentially outputs gate signals of a high level to the gate lines GL. The shift register includes a plurality of stages SRCn−1, SRCn, SRCn+1 (wherein, 'n' is a natural number). The gate drive circuit 200 is integrated on the peripheral area PA corresponding to a first end portion of the gate lines GL. In an exemplary embodiment, the gate drive circuit 200 may be integrated in correspondence with first end portions of the gate lines. In an exemplary embodiment, the gate drive circuit 200 may be integrated in correspondence with two end portions of the gate lines.

The source drive circuit 400 includes a source drive chip 410 that outputs data signals to the source lines and a flexible printed circuit board 430 on which the source drive chip 410 is mounted to electrically connect the printed circuit board 500 to the display panel 100. In an exemplary embodiment, the source drive chip 410 may be mounted on the flexible printed circuit board 430. In an exemplary embodiment, the source drive chip 410 may be directly mounted on the display panel 100. In an exemplary embodiment, the source drive chip 410 may be directly integrated on a peripheral area PA of the display panel 100.

Figure 2:
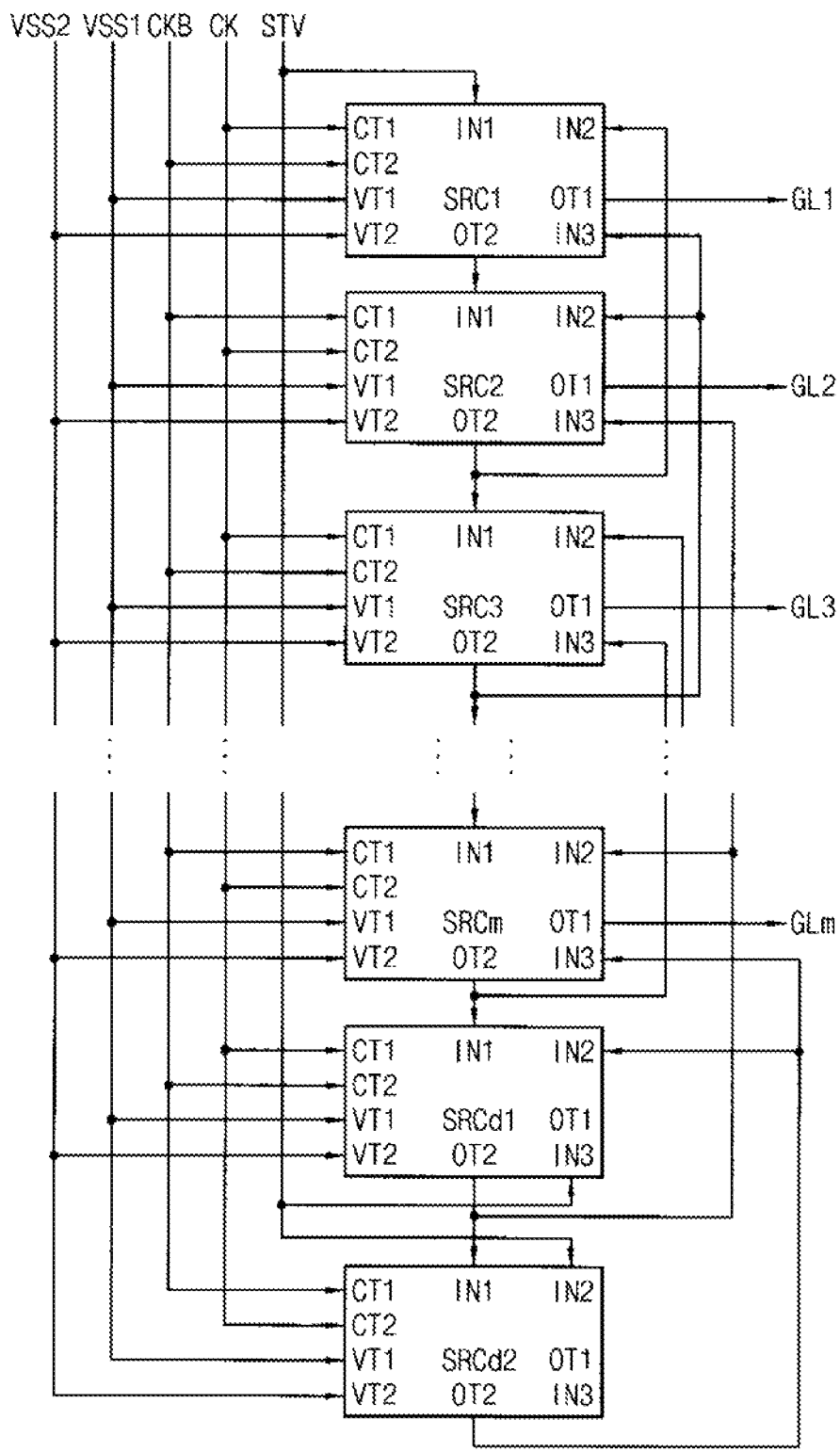
FIG. 2 is a block diagram schematically showing a gate drive circuit of the display device of FIG. 1.

FIG. 2 is a block diagram schematically showing a gate drive circuit of the display device of FIG. 1.

Referring to FIGS. 1 and 2, the gate drive circuit 200 includes a shift register including first to m-th stages SRC1, SRC2, . . . SRCm, a first dummy stage SRCd1 and a second dummy stage SRCd2 that are connected one after another to each other.

The first to m-th stages SRC1, SRC2, . . . SRCm are respectively connected to m gate lines GL1, GL2, . . . GLm to sequentially output m gate signals to the gate lines GL1, GL2, . . . GLm. The first dummy stage SRCd1 controls the operation of the (m−1)-th stage SRCm−1 and m-th stage SRCm, and the second dummy stage SRCd2 controls an operation of the m-th stage SRCm and first dummy stage SRCd1. The first and second dummy stages SRCd1, SRCd2 are not electrically connected to the gate lines GL1, GL2, . . . GLm. For example, the first to m-th stages SRC1, SRC2, . . . SRCm and the first and second dummy stages SRCd1, SRCd2 may be sequentially disposed thereon.

Each of the stages includes a first clock terminal CT1, a second clock terminal CT2, a first input terminal IN1, a second input terminal IN2, a third input terminal IN3, a first voltage terminal VT1, a second voltage terminal VT2, a first output terminal OT1 and a second output terminal OT2.

The first clock terminal CT1 receives a first clock signal CK or a second clock signal CKB having a phase different from the first clock signal CK. The second clock signal CKB may have a phase opposite to the first clock signal CK. For example, the first clock terminals CT1 of odd-numbered stages SRC1, SRC3, . . . SRCd1 receive the first clock signal CK, and the first clock terminals CT1 of even-numbered stages SRC2, SRC4, . . . SRCd2 receive the second clock signal CKB. The first clock signal CK and the second clock signal CKB may be a high voltage VDD and a first low voltage VSS1.

The second clock terminal CT2 receives the first clock signal CK or the second clock signal CKB. For example, the second clock terminals CT2 of odd-numbered stages SRC1, SRC3, . . . SRCd1 receive the second clock signal CKB, and the second clock terminals CT2 of even-numbered stages SRC2, SRC4, SRCd2 receive the first clock signal CK. The first clock signal CK and the second clock signal CKB may be a high voltage VDD and a first low voltage VSS1.

The first input terminal IN1 receives a vertical start signal STV or an (n−1)-th carry signal CRn−1, wherein 'n' is a natural number. For example, the first input terminal IN1 of the first stage SRC1 receives the vertical start signal STV, and the first input terminals IN1 of the second to second dummy stages SRC2, SRCd2 receive the (n−1)-th carry signal CRn−1.

The second input terminal IN2 receives an (n+1)-th carry signal CRn+1 or the vertical start signal STV. The second input terminal IN2 of the first stage to first dummy stage SRC1, . . . SRCd1 receive the (n+1)-th carry signal CRn+1, and the second input terminal IN2 of the second dummy stage SRCd2 receives the vertical start signal STV. The vertical start signal STV received at the second input terminal IN2 of the second dummy stage SRCd2 may be a vertical start signal corresponding to a following frame.

The third input terminal IN3 receives a carry signal of an (n+2)-th stage CRn+2 or the vertical start signal STV. For example, the third input terminals IN3 of the first to m-th stages SRC1, SRC2, . . . SRCm respectively receive a carry signal of an (n+2)-th stage, and the third input terminal IN3 of the first dummy stage SRCd1 receives the vertical start signal STV. The vertical start signal STV received at the third input terminal IN3 of the first dummy stage SRCd1 may be a vertical start signal corresponding to an (n+1)-th frame.

The first voltage terminal VT1 receives the first low voltage VSS1. The first low voltage VSS1 has a first low level. The first low level corresponds to a discharging level of the gate signal. For example, the first low level may be about −5.6V.

The second voltage terminal VT2 receives a second low voltage VSS2 having a second low level lower than the first low level VSS1. The second low level corresponds to a discharging level of a first node (hereinafter, Q node) included in the stage. For example, the second low level is about −10V.

The first output terminal OT1 electrically is connected to a corresponding gate line to output the gate signal. The first output terminals OT1 of the first to m-th stages SRC1, SRC2, . . . SRCm output first to m-th gate signals. The first output terminals OT1 of the first and second dummy stages SRCd1, SRCd2 do not output gate signals.

The second output terminal OT2 outputs the carry signal. The second output terminal OT2 is electrically connected to a first input terminal IN1 of an (n+1)-th stage SRCn+1. Moreover, the second output terminal OT2 is electrically connected to a second input terminal IN2 of an (n−1)-th stage SRCn-1 and a third input terminal IN3 of an (n−2)-th stage SRCn-2.

Figure 3:
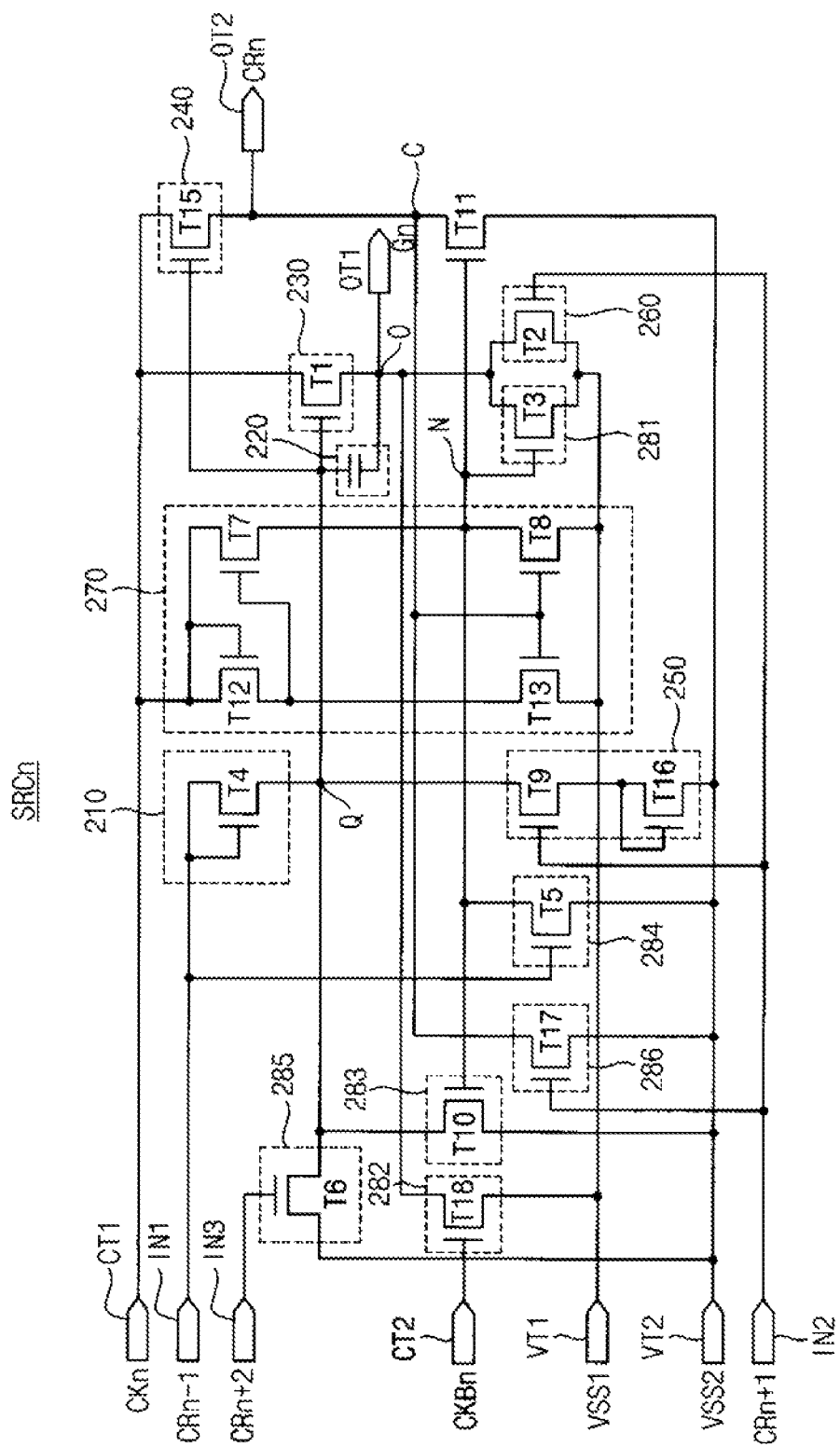
FIG. 3 is an equivalent circuit diagram schematically showing a stage of FIG. 2.
Figure 4:
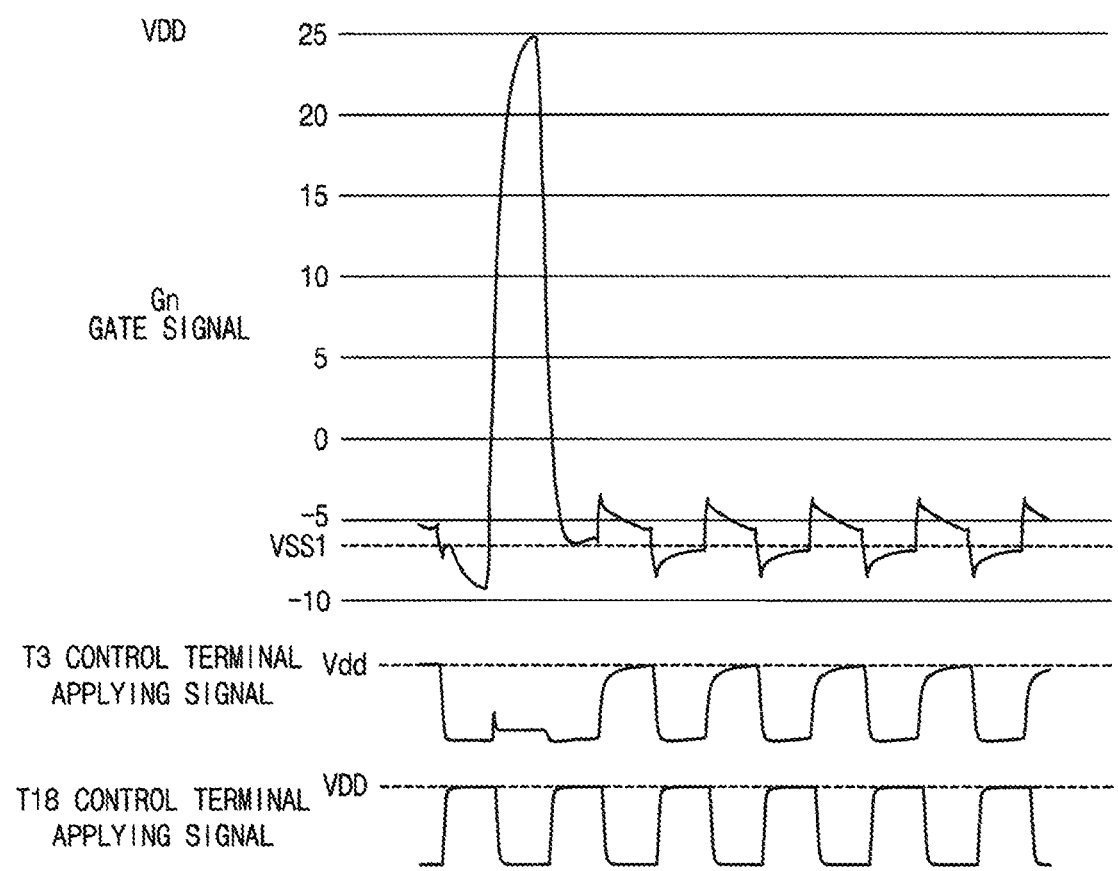
FIG. 4 is a waveform diagram schematically showing a signal of the stage shown in FIG. 3.

FIG. 3 is an equivalent circuit diagram schematically showing a stage of FIG. 2. FIG. 4 is a waveform diagram schematically showing gate signal Gn along with certain control terminal voltages of the stage shown in FIG. 3.

Referring to FIGS. 2 and 3, an n-th stage SRCn according to an exemplary embodiment may includes a buffer part 210, a charging part 220, a pull-up part 230, a carry part 240, a discharging part 250, a pull-down part 260, a switching part 270, a first maintaining part 281 and a second maintaining part 282. Hereinafter, it will be described that the n-th stage SRCn is one of the odd-numbered stages.

The buffer part 210 includes a fourth transistor T4. Control terminal and input terminal of the fourth transistor T4 are connected to the first input terminal IN1 receiving an (n−1)-th carry signal CRn−1, and an output terminal of the fourth transistor T4 is connected to a node Q. The node Q is connected to a first end portion of the charging part 220. When a high voltage VDD of the vertical start signal STC is received, the charging part 220 charges a first voltage V1 corresponding to the high voltage VDD. In the fourth transistor T4, the control terminal, the input terminal and the output terminal may be a gate electrode, a source electrode and a drain electrode, respectively.

The pull-up part 230 includes a first transistor T1. The first transistor T1 includes a control terminal connected to the node Q, an input terminal connected to the first clock terminal CT1 and an output terminal connected to an output node O. The control terminal of the first transistor T1 is connected to a first terminal of the charging part 220, and the output node O is connected to the first output terminal OT1. A first terminal of the charging part 220 is connected to the node Q. The control terminal, the input terminal and the output terminal of the first transistor T1 may be a gate electrode, a source electrode and a drain electrode, respectively.

In a state that the first voltage V1 charged in the charging part 220 is applied to a control terminal of the pull-up part 230, when a high voltage VDD of the first clock signal CKn is received at the first clock terminal CT1, the pull-up part 230 is bootstrapped. At this time, the node Q connected to the control terminal of the pull-up part 230 is boosted by a boosting voltage VBT at the first voltage V1.

When the boosting voltage VBT is applied to a control terminal of the pull-up part 230, the pull-up part 230 outputs a high voltage VDD of the first clock signal CKn as a high voltage VDD of an n-th gate signal Gn.

The carry part 240 includes a fifteenth transistor T15. The fifteenth transistor T15 includes a control terminal connected to the node Q, an input terminal connected to the first clock terminal CT1 and an output terminal connected to a second output terminal OT2. When a high voltage is applied to the node Q, the carry part 240 outputs a high voltage VDD of the first clock signal CKn received at the clock terminal CT as an n-th carry signal CRn. The control terminal, the input terminal and the output terminal of the fifteenth transistor T15 may be a gate electrode, a source electrode and a drain electrode, respectively.

The discharging part 250 includes a ninth transistor T9 and a sixteenth transistor T16. The ninth transistor T9 includes a control terminal connected to the second input terminal IN2, an input terminal connected to the node Q, and an output terminal connected to the sixteenth transistor T16. The sixteenth transistor T16 includes a control terminal and an input terminal that are commonly connected to the output terminal of the ninth transistor T9, and an output terminal connected to a second voltage terminal VT2. When an (n+1)-th carry signal CRn+1 is received at the second input terminal IN2, the discharging part 250 discharges a voltage of the node Q into the second voltage VDD2 applied to the second voltage terminal VT2. The control terminal, the input terminal and the output terminal of the ninth transistor T9 may be a gate electrode, a source electrode and a drain electrode, respectively. Moreover, the control terminal, the input terminal and the output terminal of the sixteenth transistor T16 may be a gate electrode, a source electrode and a drain electrode, respectively.

The pull-down part 260 includes a second transistor T2. The second transistor T2 includes a control terminal connected to the second input terminal IN2, an input terminal connected to the output node O and an output terminal connected to the first input terminal VT1. When the (n+1) carry signal CRn+1 is applied to the second input terminal IN2, the pull-down part 260 discharges a voltage of the output node O into the first voltage VSS1 applied to the first voltage terminal VT1. The control terminal, the input terminal and the output terminal of the second transistor T2 may be a gate electrode, a source electrode and a drain electrode, respectively.

The switching part 270 includes a twelfth transistor T12, a seventh transistor T7, a thirteenth transistor T13 and an eighth transistor T8. A control terminal and an input terminal of the twelfth transistor T12 are connected to the first clock terminal CT1, and an output terminal of the twelfth transistor T12 is connected to an input terminal of the thirteenth transistor T13 and the seventh transistor T7. The seventh transistor T7 includes a control terminal connected to an output terminal of the twelfth transistor T12, an input terminal connected to the first clock terminal CT, and an output terminal connected to an input terminal of the eighth transistor T8. An output terminal of the seventh transistor T7 is connected to a node N. The thirteenth transistor T13 includes a control terminal connected to a node C connected to the second output node OT2, an input terminal connected to the twelfth transistor T12, and an output terminal connected to the first voltage terminal VT1. The eighth transistor T8 includes a control terminal connected to the node C, an input terminal connected to the node N, and an output terminal connected to the first voltage terminal VT1. The control terminal, the input terminal and the output terminal of the twelfth transistor T12 may be a gate electrode, a source electrode and a drain electrode, respectively. The control terminal, the input terminal and the output terminal of the seventh transistor T7 may be a gate electrode, a source electrode and a drain electrode, respectively. The control terminal, the input terminal and the output terminal of the thirteenth transistor T13 may be a gate electrode, a source electrode and a drain electrode, respectively. The control terminal, the input terminal and the output terminal of the eighth transistor T8 may be a gate electrode, a source electrode and a drain electrode, respectively.

In an interval when a high voltage is applied to the node C, the switching part 270 discharges the first clock signal CKn received at the first clock terminal CT1 into the first voltage VSS1 applied to the first voltage terminal VT1. That is, the eighth and thirteenth transistors T8, T13 are turned on in response to a high voltage of the node C, and thus the first clock signal CKn of the node N is discharged into the first voltage VSS1.

The node N is synchronized with the first clock signal CKn received at the first clock terminal CT1 during a gate output off interval Gout-off when a voltage is applied to the node C, and a node N signal having a phase the same as the first clock signal CKn is applied to the switching part 270. That is, when a voltage is applied to the node C, the eighth and thirteenth transistors T8, T13 are turned on so that the node N signal having a high voltage Vdd lower than a high voltage VDD of the first clock signal CKn is applied to the node N. A first clock signal CKn is applied via the seventh and twelfth transistors T7, T12 and parasitic capacitors, so that a high voltage Vdd of the node N signal has a low level lower than a high voltage VDD of the first clock signal CKn.

The first maintaining part 281 includes a third transistor T3. The third transistor T3 includes a control terminal connected to the node N, an input terminal connected to the output node O and an output terminal connected to the first voltage terminal VT1. The first maintaining part 281 maintains a voltage of the output node O at the first voltage VSS1 in response to the node N signal during the gate output off interval Gout-off. That is, the first maintaining part 281 maintains a voltage of the output node O at the first voltage VSS1 in response to a high voltage Vdd of the node N signal having a phase the same as the first clock signal CKn. The control terminal, the input terminal and the output terminal of the third transistor T3 may be a gate electrode, a source electrode and a drain electrode, respectively.

The second maintaining part 282 includes an eighteenth transistor T18. The eighteenth transistor T18 includes a control terminal connected to the second clock terminal CT2, an input terminal connected to the output node O, and an output terminal connected to the first voltage terminal VT1. The second maintaining part 282 maintains a voltage of the output node O at the first voltage VSS1 in response to the second clock signal CKBn received from the second clock terminal CT2 during the gate output off interval Gout-off. That is, the second maintaining part 282 maintains a voltage of the output node O at the first voltage VSS1 in response to a high voltage VDD of the second clock signal CKBn. That is, the second maintaining part 282 maintains a voltage of the output node O at the first voltage VSS1 during an interval that a low voltage of the node N signal is applied to turn off the third transistor T3. Thus, a voltage of the output node O may be prevented from being floated during an interval when a low voltage of the node N signal is applied. The control terminal, the input terminal and the output terminal of the eighteenth transistor T18 may be a gate electrode, a source electrode and a drain electrode, respectively.

The n-th stage SRCn according to the present exemplary embodiment may further include a third maintaining part 283, a fourth maintaining part 284, a fifth maintaining part 285 and a sixth maintaining part 286.

The third maintaining part 283 includes a tenth transistor T10. The tenth transistor T10 includes a control terminal connected to the node N, an input terminal connected to the node Q and an output terminal connected to the second voltage terminal VT2. The third maintaining part 283 maintains a voltage of the node Q at the second voltage VSS2 in response to the node N signal during the gate output off interval Gout-Off. The node N signal has a phase same as a phase of the first clock signal CKn during the gate output off interval Gout-Off. The control terminal, the input terminal and the output terminal of the tenth transistor T10 may be a gate electrode, a source electrode and a drain electrode, respectively.

The fourth maintaining part 284 includes a fifth transistor T5. The fifth transistor T5 includes a control terminal connected to the first input terminal IN1, an input terminal connected to the node N and an output terminal connected to the second voltage terminal VT2. The fourth maintaining part 284 maintains a voltage of the node N at the second voltage VSS2 in response to the (n−1)-th carry signal CRn−1. The control terminal, the input terminal and the output terminal of the fifth transistor T5 may be a gate electrode, a source electrode and a drain electrode, respectively.

The fifth maintaining part 285 includes a sixth transistor T6. The sixth transistor T6 includes a control terminal connected to the third input terminal IN3, an input terminal connected to the node Q and an output terminal connected to the second voltage terminal VT2. The fifth maintaining part 285 maintains a voltage of the node Q at the second voltage VSS2 in response to the (n+2)-th carry signal CRn+1 received at the third input terminal IN3 during the gate output off interval Gout-Off. The control terminal, the input terminal and the output terminal of the sixth transistor T6 may be a gate electrode, a source electrode and a drain electrode, respectively.

The sixth maintaining part 286 includes a seventeenth transistor T17. The seventeenth transistor T17 includes a control terminal connected to the second input terminal IN2, an input terminal connected to the node Q and an output terminal connected to the second voltage terminal VT2. The sixth maintaining part 286 maintains a voltage of the node Q at the second voltage VSS2 in response to the (n+1)-th carry signal CRn+1 during the gate output off interval Gout-Off. The control terminal, the input terminal and the output terminal of the seventeenth transistor T17 may be a gate electrode, a source electrode and a drain electrode, respectively.

Figure 5:
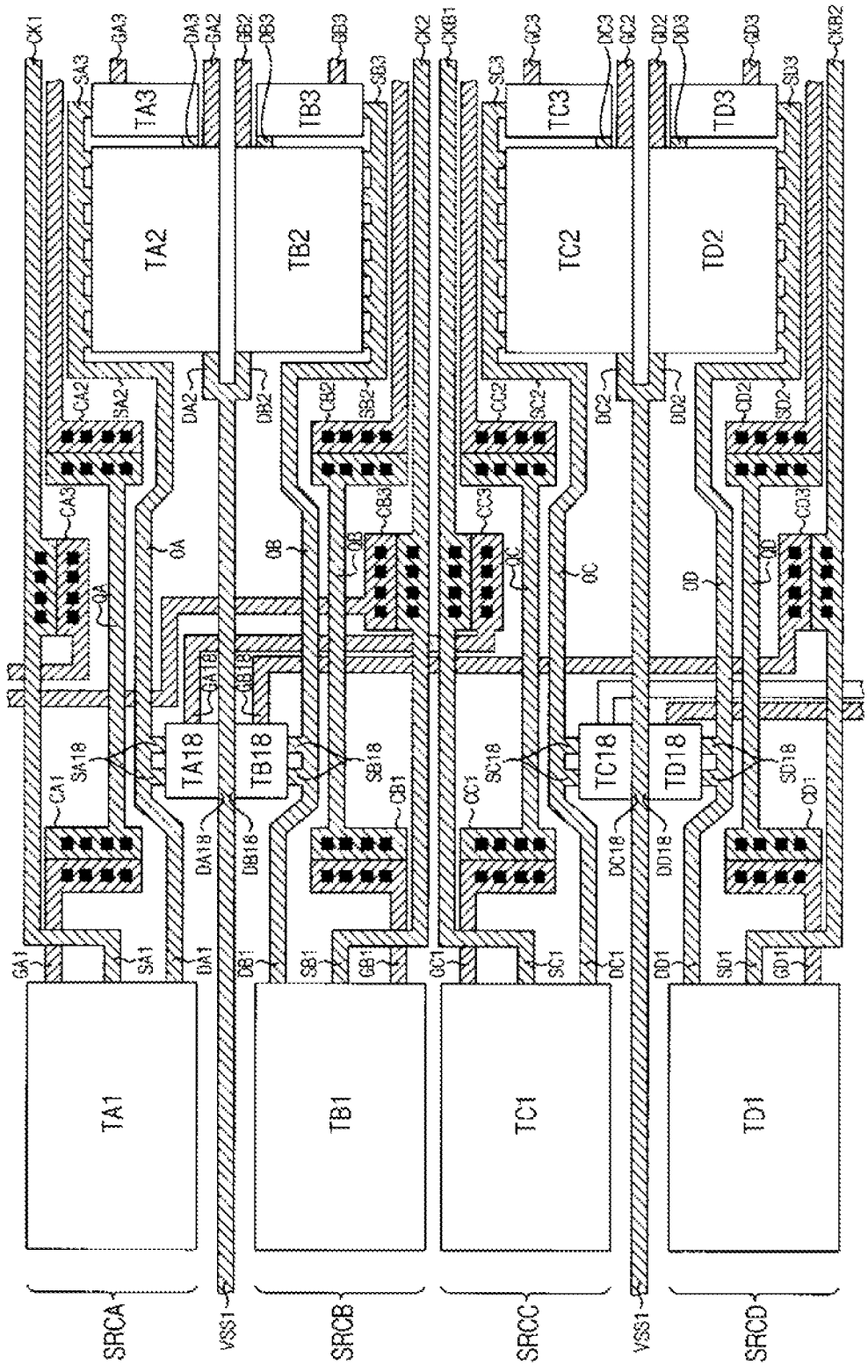
FIG. 5 is a layout schematically showing a portion of a gate drive circuit shown in FIG. 2.

FIG. 5 is a layout schematically showing an exemplary embodiment of a portion of the gate drive circuit 200 shown in FIG. 2.

In FIG. 5, there are four stages SRCA, SRCB, SRCC, SRCD. In FIG. 5, two kinds of first clock signal CK1, CK2 and two kinds of second clock signal CKB1, CKB2 respectively corresponding to the first clock signal CK1, CK2 are applied to the four stages SRCA, SRCB, SRCC, SRCD. In this case, CKB1 signal may have a phase opposite to CK1 signal. CKB2 signal may have a phase opposite to CK2 signal.

CK1 signal is a clock signal corresponding to a gate signal of the SRCA stage, and CK2 signal is a clock signal corresponding to a gate signal of the SRCB stage. CKB1 signal is a clock signal corresponding to a gate signal of the SRCC stage, and CKB2 signal is a clock signal corresponding to a gate signal of the SRCD stage.

The SRCC stage may be a previous stage of the SRCA stage. For example, when it is assumed that the SRCA state is an N-th stage, the SRCC stage may be an (N−1)-th stage. The SRCD stage may be a previous stage of the SRCB stage. For example, when it is assumed that the SRCB state is an N-th stage, the SRCD stage may be an (N−1)-th stage.

In an exemplary embodiment, one kind of first clock signal CK and one kind of second clock signal CKB may be applied to the gate drive circuit 200.

In FIG. 5, there is an area on which the first transistor T1 of the pull-up part 230, the second transistor T2 of the pull-down part 260, the third transistor T3 of the first maintaining part 281 and the eighteenth transistor T18 of the second maintaining part 282 are disposed.

In FIG. 5, an area hatched from upper left to lower right represents a gate metal layer including a gate electrode, and an area hatched from lower left to upper right represents a source metal layer including a source electrode and a drain electrode.

Referring to FIGS. 2, 3 and 5, a first transistor TA1, a second transistor TA2, a third transistor TA3 and an eighteenth transistor TA18 are disposed on a SRCA stage. The first transistor TA1 is included in the pull-up part 230, and the second transistor TA2 is included in the pull-down part 260. The third transistor TA3 is included in the first maintaining part 281, and the eighteenth transistor TA18 is included in the second maintaining part 282.

The first transistor TA1 includes a gate electrode GA1, a source electrode SA1 and a drain electrode DA1, and the second transistor TA2 includes a gate electrode GA2, a source electrode SA2 and a drain electrode DA2. The third transistor TA3 includes a gate electrode GA3, a source electrode SA3 and a drain electrode DA3, and the eighteenth transistor TA18 includes a gate electrode GA18, a source electrode SA18 and a drain electrode DA18.

In an exemplary embodiment, the eighteenth transistor TA18 may be disposed between the first and second transistors TA1, TA2.

A CKB1 signal that is a second clock signal is applied to a gate electrode GA18 of the eighteenth transistor TA18 of a SRCA stage which generates a gate signal based upon a CK1 signal that is a first clock signal.

The gate electrode GA18 of the eighteenth transistor TA18 may be connected to CKB1 signal line disposed within a SRCC stage corresponding to a previous stage of the SRCA stage. The gate electrode GA18 of the eighteenth transistor TA18 may be connected to a CKB1 signal line through a third contact portion CC3 disposed within the SRCC stage.

A first contact portion CA1 and a second contact portion CA2 for delivering a signal of a gate electrode GA1 of the first transistor TA1 to another element (e.g., a source electrode of a sixth transistor T6) may be disposed within the SRCA stage. The first contact portion CA1 delivers a signal of the gate electrode GA1 to the source metal layer from the gate metal layer. The second contact portion VA1 delivers a signal of the gate electrode GA1 to the gate metal layer from the source metal layer. The first contact portion CA1 and the second contact portion CA2 correspond to a node QA of a SRCA stage.

A third contact portion CA3 for delivering the CK1 signal to another element (e.g., a gate electrode of the eighteenth transistor T18 of another stage) may be disposed within the SRCA stage. The third contact portion CA3 delivers the CK1 signal to the gate metal layer from the source metal layer.

A first transistor TB1, a second transistor TB2, a third transistor TB3 and an eighteenth transistor TB18 are disposed on a SRCB stage.

In an exemplary embodiment, the eighteenth transistor TB18 may be disposed between the first and second transistors TB1, TB2.

A CKB2 signal that is a clock signal is applied to a gate electrode GB18 of the eighteenth transistor TB18 of a SRCB stage which generates a gate signal based upon a CK2 signal that is a first clock signal.

The gate electrode GB18 of the eighteenth transistor TB18 may be connected to CKB2 signal line disposed within a SRCD stage corresponding to a previous stage of the SRCB stage. The gate electrode GB18 of the eighteenth transistor TB18 may be connected to a CKB2 signal line through a third contact portion CD3 disposed within the SRCD stage.

A first contact portion CB1 and a second contact portion CB2 for delivering a signal of a gate electrode GB1 of the first transistor TB1 to another element (e.g., a source electrode of a sixth transistor T6) may be disposed within the SRCB stage.

A third contact portion CB3 for delivering the CK2 signal to another element (e.g., a gate electrode of the eighteenth transistor T18 of another stage) may be disposed within the SRCB stage.

A first transistor TC1, a second transistor TC2, a third transistor TC3 and an eighteenth transistor TC18 are disposed on a SRCC stage.

In an exemplary embodiment, the eighteenth transistor TC18 may be disposed between the first and second transistors TC1, TC2.

A first contact portion CC1 and a second contact portion CC2 for delivering a signal of a gate electrode GC1 of the first transistor TC1 to another element (e.g., a source electrode of a sixth transistor T6) may be disposed within the SRCC stage.

A third contact portion CC3 for delivering the CKB1 signal to another element (e.g., a gate electrode of the eighteenth transistor T18 of another stage) may be disposed within the SRCC stage.

A first transistor TD1, a second transistor TD2, a third transistor TD3 and an eighteenth transistor TD18 are disposed on a SRCD stage.

In an exemplary embodiment, the eighteenth transistor TD18 may be disposed between the first and second transistors TD1, TD2.

A first contact portion CD1 and a second contact portion CD2 for delivering a signal of a gate electrode GD1 of the first transistor TD1 to another element (e.g., a source electrode of a sixth transistor T6) may be disposed within the SRCD stage.

A third contact portion CD3 for delivering the CKB2 signal to another element (e.g., a gate electrode of the eighteenth transistor T18 of another stage) may be disposed within the SRCD stage.

The gate drive circuit 200 according to an exemplary embodiment may include a second maintaining part having a control terminal connected to a second clock signal, an input terminal connected to a gate output terminal Gn and an output terminal receiving a first voltage VSS1, so that the gate output terminal Gn may be maintained at a first voltage VSS1 in a low level interval of a first clock signal CKn during a gate output off interval Gout-off. Accordingly, the gate signal may be prevented from being floated such that driving reliability of a display device may be secured. In addition, a display quality of the display device may be improved.

Figure 6:
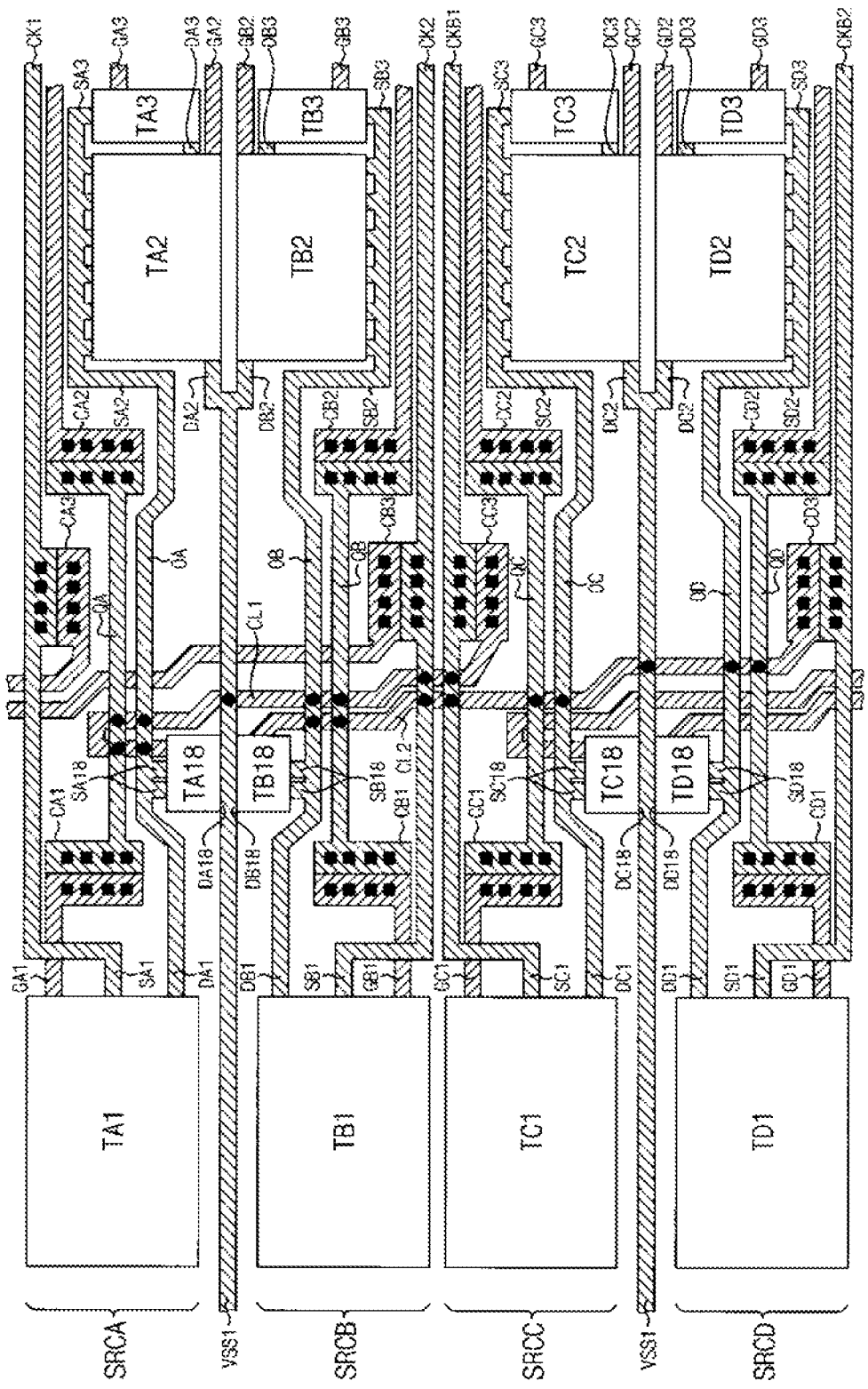
FIG. 6 is a layout schematically showing a portion of a gate drive circuit of a display device according to an exemplary embodiment of the present invention.

FIG. 6 is a layout schematically showing a portion of a gate drive circuit of a display device according to an exemplary embodiment of the present invention.

The display device according to the present exemplary embodiment is substantially the same as the display device described with reference to FIG. 1 except for a layout of a gate drive circuit.

A gate drive circuit according to the present exemplary embodiment is substantially the same as the layout of the gate drive circuit described with reference to FIG. 5 except for a line connecting to a gate electrode of an eighteenth transistor TA18 of a SRCA stage and a third contact portion CC3 of a SRCC stage. Thus, identical reference numerals are used in FIG. 6 to refer to components that are the same or like those shown in FIG. 5, and thus a detailed description thereof will be omitted.

In FIG. 6, there is an area on which the first transistor T1 of the pull-up part 230, the second transistor T2 of the pull-down part 260, the third transistor T3 of the first maintaining part 281 and the eighteenth transistor T18 of the second maintaining part 282 are disposed.

In FIG. 6, an area hatched from upper left to lower right represents a gate metal layer including a gate electrode, and an area hatched from lower left to upper right represents a source metal layer including a source electrode and a drain electrode.

Referring to FIGS. 2, 3 and 6, a first transistor TA1, a second transistor TA2, a third transistor TA3 and an eighteenth transistor TA18 are disposed on a SRCA stage.

In the present exemplary embodiment, the eighteenth transistor TA18 is disposed between the first and second transistors TA1, TA2.

A CKB1 signal that is a second clock signal is applied to a gate electrode GA18 of the eighteenth transistor TA18 of a SRCA stage which generates a gate signal based upon a CK1 signal that is a first clock signal.

The gate electrode GA18 of the eighteenth transistor TA18 may be connected to CKB1 signal line disposed within a SRCC stage corresponding to a previous stage of the SRCA stage through a first connecting line CL1. The first connecting line CL1 may be formed from a gate metal layer. The gate electrode GA18 of the eighteenth transistor TA18 may be connected to a CKB1 signal line through a third contact portion CC3 disposed within the SRCC stage.

A first contact portion CA1 and a second contact portion CA2 for delivering a signal of a gate electrode GA1 of the first transistor TA1 to another element (e.g., a source electrode of a sixth transistor T6) may be disposed within the SRCA stage.

A third contact portion CA3 for delivering the CK1 signal to another element (e.g., a gate electrode of the eighteenth transistor T18 of another stage) may be disposed within the SRCA stage.

A first transistor TB1, a second transistor TB2, a third transistor TB3 and an eighteenth transistor TB18 may be disposed on a SRCB stage.

In an exemplary embodiment, the eighteenth transistor TB18 may be disposed between the first and second transistors TB1, TB2.

A CKB2 signal that is a second clock signal is applied to a gate electrode GB18 of the eighteenth transistor TB18 of a SRCB stage which generates a gate signal based upon a CK2 signal that is a first clock signal.

The gate electrode GB18 of the eighteenth transistor TB18 may be connected to CKB2 signal line disposed within a SRCD stage corresponding to a previous stage of the SRCB stage through a second connecting line CL2. The second connecting line CL2 may be formed from a gate metal layer. The gate electrode GB18 of the eighteenth transistor TB18 may be connected to a CKB2 signal line through a third contact portion CD3 disposed within the SRCD stage.

The number of points overlapped with the first connecting line CL1 connecting a gate electrode GA18 of the eighteenth transistor TA18 of the SRCA stage to a clock signal terminal of another stage and a source metal layer may be equal to the number of points overlapped with the second connecting line CL2 connecting a gate electrode GB18 of the eighteenth transistor TB18 of the SRCB stage to a clock signal terminal of another stage and a source metal layer. In an exemplary embodiment, the number of points overlapped with the first connecting line CL1 and a line of the source metal layer may be nine, and the number of points overlapped with the second connecting line CL2 and a line of the source metal layer may be nine.

In addition, a size overlapped with the first connecting line CL1 and the line of a source metal layer may be equal to a size overlapped with the second connecting line CL2 and the line of a source metal layer.

A first contact portion CB1 and a second contact portion CB2 for delivering a signal of a gate electrode GB1 of the first transistor TB1 to another element (e.g., a source electrode of a sixth transistor T6) may be disposed within the SRCB stage.

A third contact portion CB3 for delivering the CK2 signal to another element (e.g., a gate electrode of the eighteenth transistor T18 of another stage) may be disposed within the SRCB stage.

The gate drive circuit 200 according to an exemplary embodiment may include a second maintaining part having a control terminal connected to a second clock signal, an input terminal connected to a gate output terminal Gn and an output terminal receiving a first voltage VSS1, so that the gate output terminal Gn may be maintained at a first voltage VSS1 in a low level interval of a first clock signal CKn during a gate output off interval Gout-off. Accordingly, it may prevent the gate signal from being floated such that driving reliability of a display device may be secured. In addition, a display quality of the display device may be improved.

In the gate drive circuit 200 according to the present exemplary embodiment, the number of points overlapped with the first connecting line CL1 and the source metal layer is equal to the number of points overlapped with the second connecting line CL2 and the source metal layer, so that it may maintain to substantially equal a capacitance between the first connecting line CL1 and the source metal layer and a capacitance between the second connecting line CL2 and the source metal layer. Moreover, it may maintain to substantially equal a load of the first connecting line CL1 and a load of the second connecting line CL2. Thus, it may secure a driving reliability of a display device. In addition, a display quality of the display device may be improved.

Figure 7:
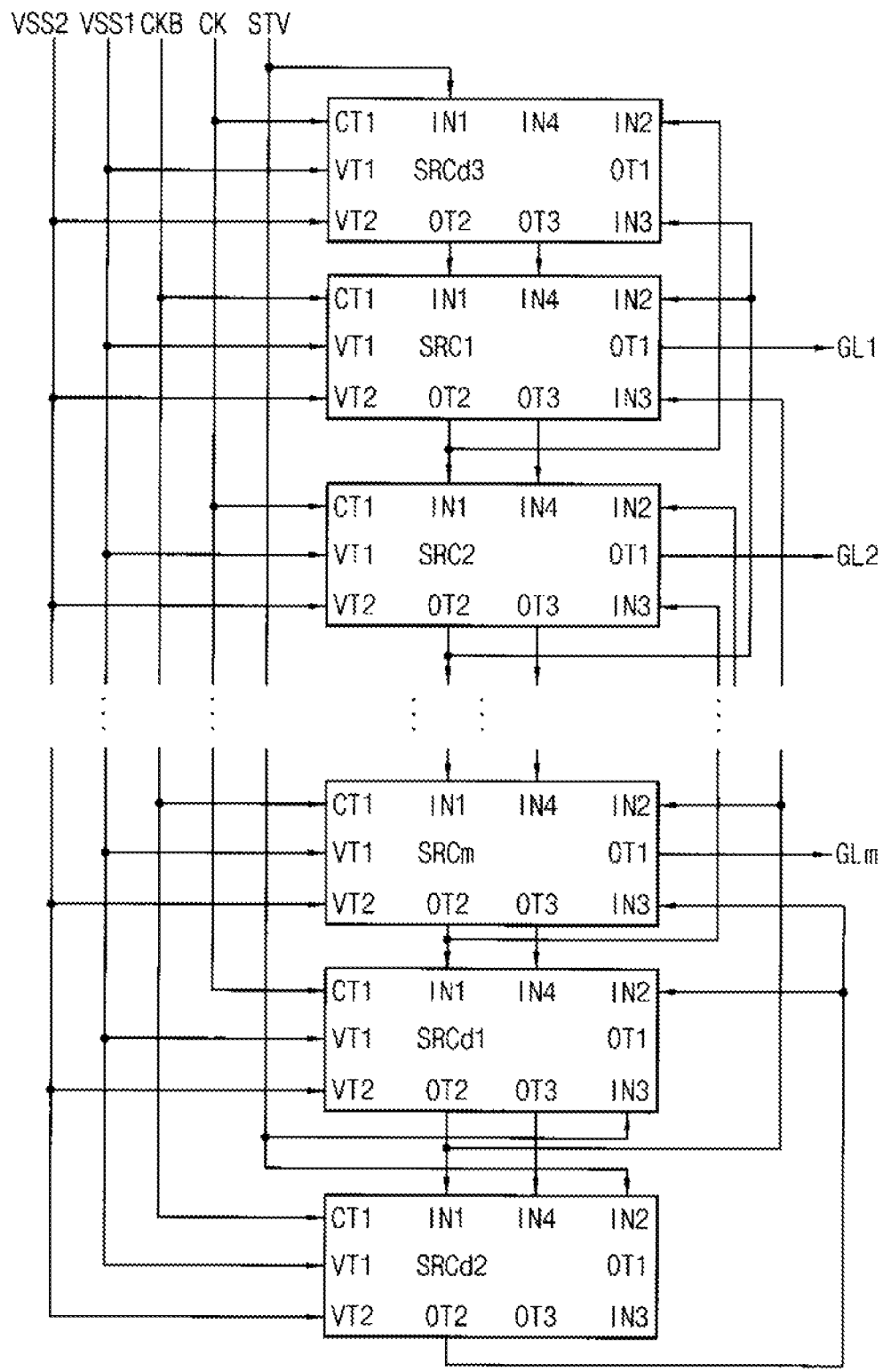
FIG. 7 is a block diagram schematically showing a gate drive circuit of a display device according to an exemplary embodiment of the present invention.

FIG. 7 is a block diagram schematically showing a gate drive circuit of a display device according to an exemplary embodiment of the present invention.

The display device according to the present exemplary embodiment is substantially the same as the display device described with reference to FIG. 1 except for a gate drive circuit.

A gate drive circuit according to the present exemplary embodiment is substantially the same as the gate drive circuit described with reference to FIG. 2 except that the gate drive circuit further include a third dummy stage, each stages does not include a second clock terminal and further includes a fourth input terminal and a third output terminal. Thus, identical reference numerals are used in FIG. 7 to refer to components that are the same or like those shown in FIG. 5, and thus a detailed description thereof will be omitted.

Referring to FIGS. 1 and 7, the gate drive circuit 200 includes a shift register including first to m-th stages SRC1, SRC2, . . . SRCm, a first dummy stage SRCd1, a second dummy stage SRCd2 and a third dummy stage SRCd3 that are connected one after another to each other.

The first to m-th stages SRC1, SRC2, . . . SRCm are respectively connected to m gate lines GL1, GL2, GLm to sequentially output m gate signals to the gate lines GL1, GL2, GLm. The first dummy stage SRCd1 controls an operation of the (m−1)-th SRCm−1 and m-th stage SRCm, and the second dummy stage SRCd2 controls an operation of the m-th stage SRCm and first dummy stage SRCd1. The third dummy stage SRCd3 controls an operation of the first stage SRC1. The first, second and third dummy stages SRCd1, SRCd2, SRCd2 are not electrically connected to the gate lines GL. For example, the third dummy stage SRCd3, the first to m-th stages SRC1, SRC2, . . . SRCm, the first dummy stage SRCd1 and the second dummy stage SRCd2 may be sequentially disposed.

Each of the stages includes a first clock terminal CT1, a first input terminal IN1, a second input terminal IN2, a third input terminal IN3, a fourth input terminal IN4, a first voltage terminal VT1, a second voltage terminal VT2, a first output terminal OT1, a second output terminal OT2 and a third output terminal OT3.

The first clock terminal CT1 receives the first clock signal CK or the second clock signal CKB. For example, the first clock terminals CT1 of odd-numbered stages SRCd3, SRC2, SRC4, . . . SRCd1 receive the first clock signal CK, and the first clock terminals CT1 of even-numbered stages SRC1, SRC3, . . . SRCd2 receive the second clock signal CKB. The first clock signal CK and the second clock signal CKB may be a high voltage VDD and a first low voltage VSS1.

The first input terminal IN1 receives a vertical start signal STV or a carry signal of a previous stage. For example, the first input terminal IN1 of the third dummy stage SRCd3 receives the vertical start signal STV, and the first input terminals IN1 of the first to second dummy stages SRC1 to SRCd2 receive the carry signal of the previous stage.

The second input terminal IN2 receives a carry signal of a following stage or the vertical start signal STV. For example, the second input terminals 1N2 of the third to first dummy stages SRCd3, SRCd2, SRCd1 receive the carry signal of the following stage, respectively, and the second input terminal IN2 of the second dummy stage SRCd2 receives the vertical start signal STV. The vertical start signal STV received at the second input terminal IN2 of the second dummy stage SRCd2 may be a vertical start signal corresponding to a following frame.

The third input terminal IN3 receives a carry signal of a next following stage or the vertical start signal STV. For example, the third input terminals IN3 of the third dummy to m-th stages SRCd3, SRC1, . . . SRCm receive the carry signal of the following stage, and the third input terminal IN3 of the first dummy stage SRCd1 receives the vertical start signal STV.

The fourth input terminal IN4 receives a node N signal of a previous stage. The node N signal of the previous stage is a signal applied to a node N of a previous stage, which is synchronized with a signal applied to a first clock terminal CT1 of a previous stage. For example, when a first clock signal CK is applied to a first clock terminal CT1 of a previous stage, a phase of a node N signal of the previous stage is substantially equal to that of the first clock signal CK. Thus, a node N signal of the previous stage has a phase different from that of a signal applied to a first clock terminal CT1 of a current stage. For example, a phase of a signal applied through a first clock terminal of a current stage and a phase of a node N signal of the previous stage may be opposite to each other. The fourth input terminals IN4 of the first stage to second dummy stages SRC1, SRC2, . . . SRCd2 receive a node N signal of the previous stage, respectively. In an exemplary embodiment, the fourth input terminal IN4 may receive a node N signal of a previous stage. However, it is not limited thereto. For example, the fourth input terminal IN4 may receive a node N signal of another stage different from the n-th stage.

The first voltage terminal VT1 receives the first low voltage VSS1. The first low voltage VSS1 has a first low level. The first low level corresponds to a discharging level of the gate signal. For example, the first low level may be about −5.6V.

The second voltage terminal VT2 receives a second low voltage VSS2 having a second low level lower than the first low level VSS1. The second low level corresponds to a discharging level of a first node (hereinafter, Q node) included in the stage. For example, the second low level is about −10V.

The first output terminal OT1 electrically connected to a corresponding gate line to output the gate signal. The first output terminals OT1 of the first to m-th stages SRC1 to SRCm output first to m-th gate signals. The first output terminals OT1 of the first and second dummy stages SRCd1, SRCd2 do not output gate signals.

The second output terminal OT2 outputs the carry signal. The second output terminal OT2 is electrically connected to a first input terminal IN1 of a following stage. Moreover, the second output terminal OT2 is electrically connected to a second input terminal IN2 of a previous stage and a third input terminal IN3 of a next previous stage.

The third output terminal OT3 outputs a node N signal. The third output terminal OT3 is electrically connected to a fourth input terminal IN4 of a following stage. In an exemplary embodiment, the third output terminal OT3 is connected to the fourth input terminal IN4 of a following stage. However, it is not limited thereto. For example, the third input terminal OT3 may be connected to a fourth input terminal 1N4 of another stage different from the n-th stage.

Figure 8:
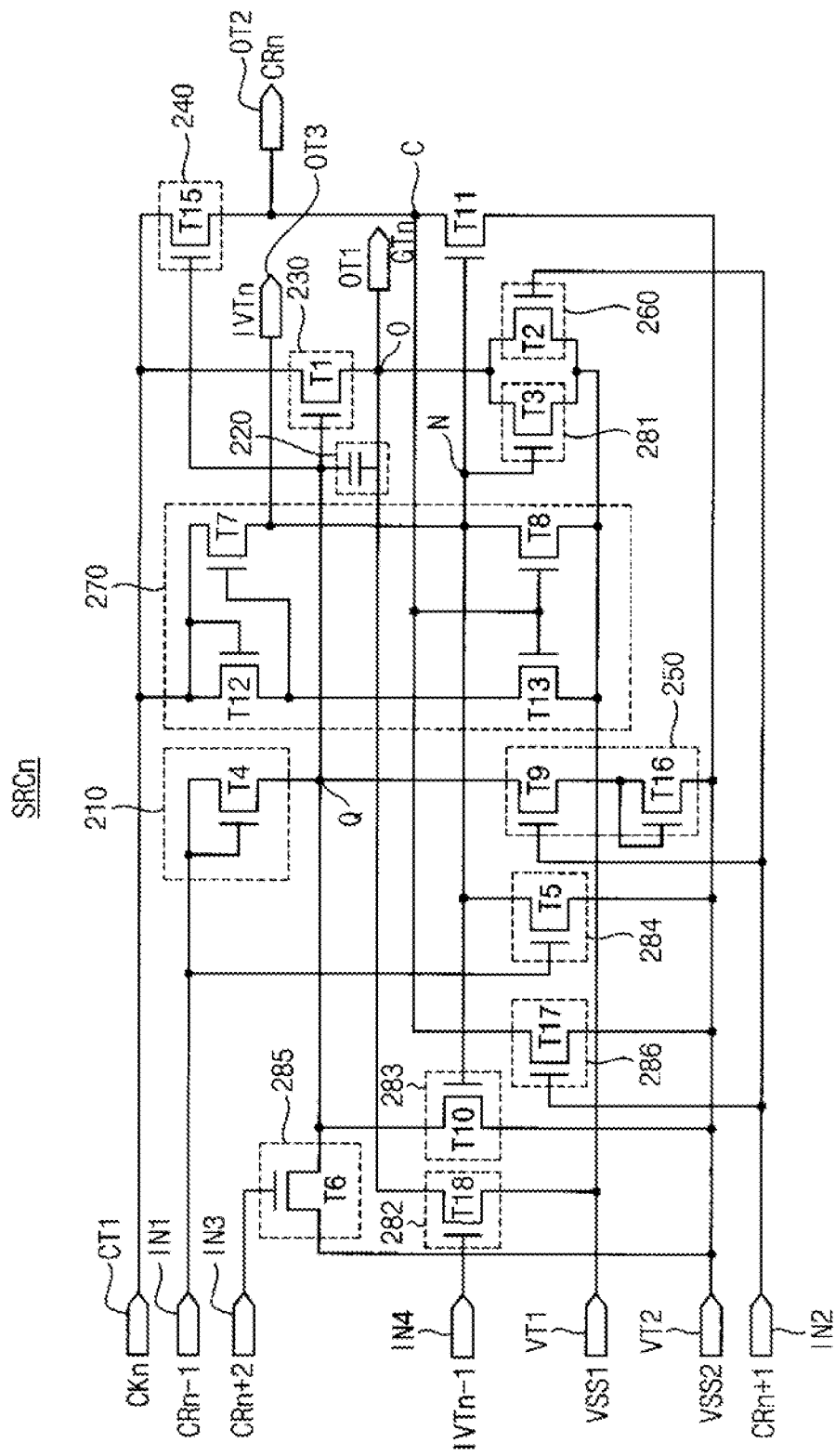
FIG. 8 is an equivalent circuit diagram schematically showing a stage of FIG. 7.
Figure 9:
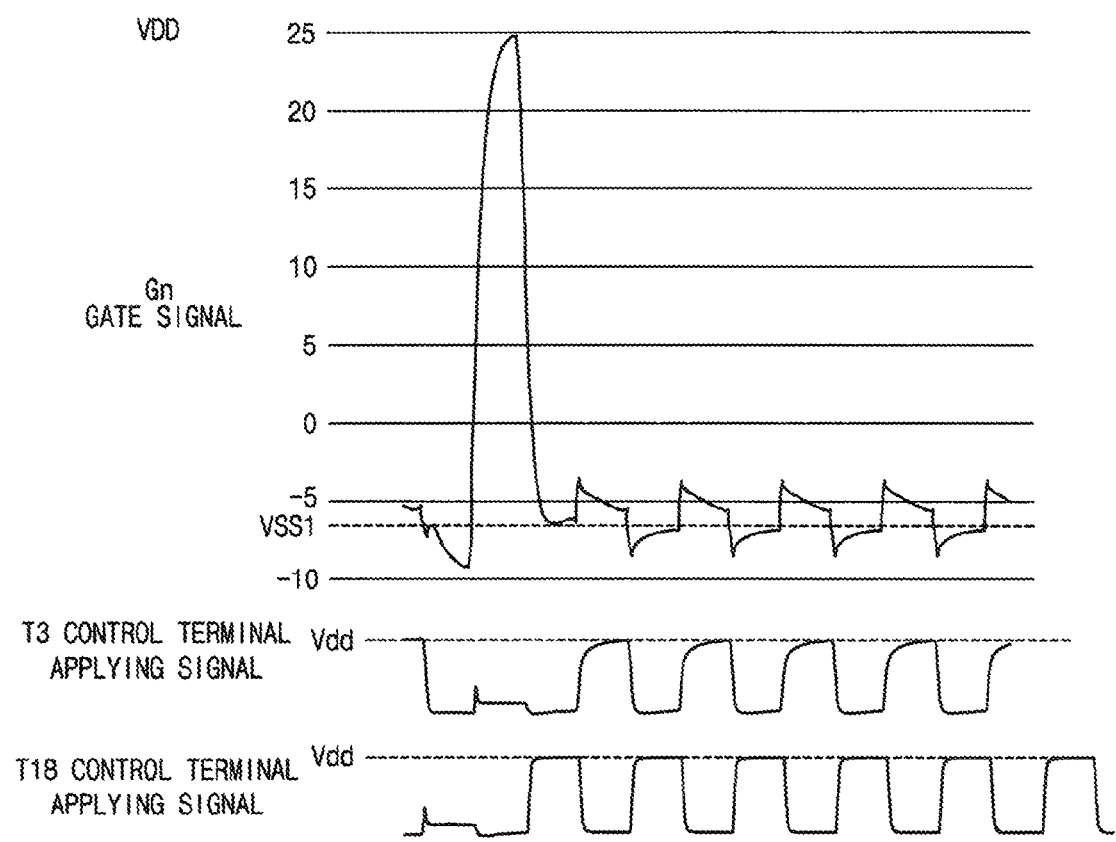
FIG. 9 is a waveform diagram schematically showing a signal of a stage shown in FIG. 7.

FIG. 8 is an equivalent circuit diagram schematically showing a stage of FIG. 7. FIG. 9 is a waveform diagram schematically showing gate signal Gn along with certain control terminal voltages of the stage shown in FIG. 7.

The gate drive circuit of FIG. 8 and a display device according to an exemplary embodiment is substantially the same as the gate drive circuit and the display device described with reference to FIGS. 1 to 5 except for a second maintaining part of the gate drive circuit. Thus, identical reference numerals are used in FIG. 8 to refer to components that are the same or like those shown in FIGS. 1 to 5, and thus a detailed description thereof will be omitted.

Referring to FIGS. 7 to 10, an n-th stage SRCn according to an exemplary embodiment includes a buffer part 210, a charging part 220, a pull-up part 230, a carry part 240, a discharging part 250, a pull-down part 260, a switching part 270, a first maintaining part 281 and a second maintaining part 282. Hereinafter, it will be described that the n-th stage SRCn is one in odd-numbered stages.

The second maintaining part 282 includes an eighteenth transistor T18. The eighteenth transistor T18 includes a control terminal connected to the fourth input terminal IN4, an input terminal connected to the output node O, and an output terminal connected to the first voltage terminal VT1. The second maintaining part 282 maintains a voltage of the output node O at the first voltage VSS1 in response to a node N signal IVTn−1 of a previous stage received from the fourth input terminal IN4 during the gate output off interval Gout-off. The second maintaining part 282 maintains a voltage of the output node O at the first voltage VSS1 in response to a high voltage Vdd of the node N signal IVTn−1 of the previous stage. That is, the second maintaining part 282 maintains a voltage of the output node O at the first voltage VSS1 during an interval when a low voltage of the node N signal IVTn is applied to turn off the third transistor T3. Thus, a voltage of the output node O may be prevented from being floated during an interval that a low voltage of the node N signal IVTn is applied.

In an exemplary embodiment, the second maintaining part 282 may be connected to the node N signal IVTn−1 of a previous stage. However, it is not limited thereto. For example, the second maintaining part 282 may be connected to one of Node N signals of previous stages.

In an exemplary embodiment, the second maintaining part 282 may be connected to one of node N signals of following stages.

The n-th stage SRCn according to an exemplary embodiment may further include a third maintaining part 283, a fourth maintaining part 284, a fifth maintaining part 285 and a sixth maintaining part 286.

The third maintaining part 283 includes a tenth transistor T10. The tenth transistor T10 includes a control terminal connected to the node N, an input terminal connected to the node Q and an output terminal connected to the second voltage terminal VT2. The third maintaining part 283 maintains a voltage of the node Q at the second voltage VSS2 in response to the node N signal during the gate output off interval Gout-Off. The node N signal has a phase the same as a phase of the first clock signal CKn during the gate output off interval Gout-Off.

The fourth maintaining part 284 includes a fifth transistor T5. The fifth transistor T5 includes a control terminal connected to the first input terminal IN1, an input terminal connected to the node N and an output terminal connected to the second voltage terminal VT2. The fourth maintaining part 284 maintains a voltage of the node N at the second voltage VSS2 in response to the (n−1)-th carry signal CRn−1.

The fifth maintaining part 285 includes a sixth transistor T6. The sixth transistor T6 includes a control terminal connected to the third input terminal IN3, an input terminal connected to the node Q and an output terminal connected to the second voltage terminal VT2. The fifth maintaining part 285 maintains a voltage of the node Q at the second voltage VSS2 in response to the (n+2)-th carry signal CRn+1 received at the third input terminal IN3 during the gate output off interval Gout-Off.

The sixth maintaining part 286 includes a seventeenth transistor T17. The seventeenth transistor T17 includes a control terminal connected to the second input terminal IN2, an input terminal connected to the node Q and an output terminal connected to the second voltage terminal VT2. The sixth maintaining part 286 maintains a voltage of the node Q at the second voltage VSS2 in response to the (n+1)-th carry signal CRn+1 during the gate output off interval Gout-Off.

Figure 10:
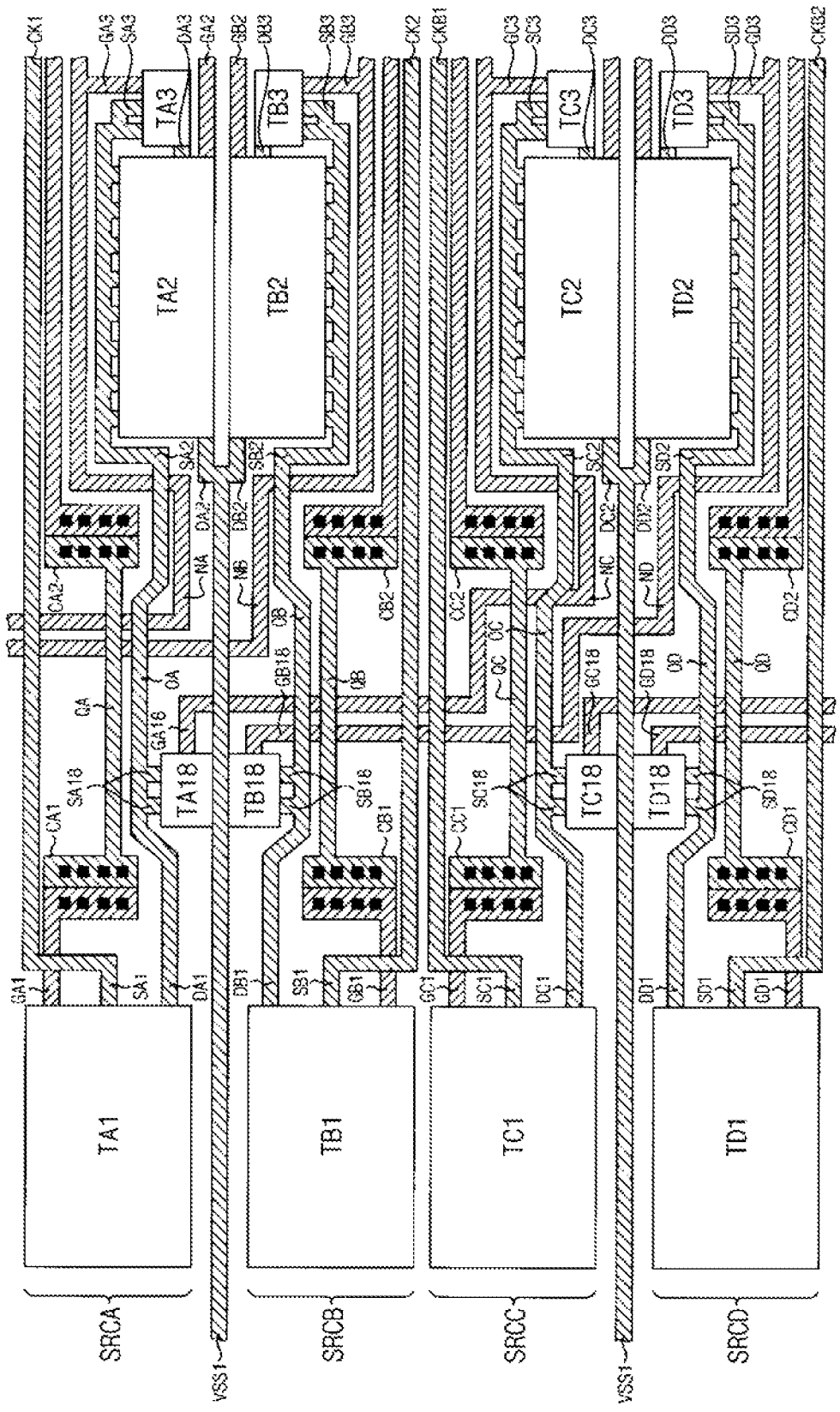
FIG. 10 is a layout schematically showing a portion of a gate drive circuit shown in FIG. 7.

FIG. 10 is a layout schematically showing a portion of a gate drive circuit shown in FIG. 7.

In FIG. 10, there are four stages SRCA, SRCB, SRCC, SRCD. In FIG. 10, two kinds of first clock signal CK1, CK2 and two kinds of second clock signal CKB1, CKB2 respectively corresponding to the first clock signal CK1, CK2 are applied to the four stages SRCA, SRCB, SRCC, SRCD. In this case, CKB1 signal may have a phase opposite to CK1 signal. CKB2 signal may have a phase opposite to CK2 signal.

CK1 signal is a clock signal corresponding to a gate signal of the SRCA stage, and CK2 signal is a clock signal corresponding to a gate signal of the SRCB stage. CKB1 signal is a clock signal corresponding to a gate signal of the SRCC stage, and CKB2 signal is a clock signal corresponding to a gate signal of the SRCD stage.

The SRCC stage may be a previous stage of the SRCA stage. For example, when it is assumed that the SRCA state is an N-th stage, the SRCC stage may be an (N−1)-th stage. The SRCD stage may be a previous stage of the SRCB stage. For example, when it is assumed that the SRCB state is an N-th stage, the SRCD stage may be an (N−1)-th stage.

In an exemplary embodiment, one kind of first clock signal CK and one kind of second clock signal CKB may be applied to the gate drive circuit 200.

In FIG. 10, there is an area on which the first transistor T1 of the pull-up part 230, the second transistor T2 of the pull-down part 260, the third transistor T3 of the first maintaining part 281 and the eighteenth transistor T18 of the second maintaining part 282 are disposed.

In FIG. 10, an area hatched from upper left to lower right represents a gate metal layer including a gate electrode, and an area hatched from lower left to upper right represents a source metal layer including a source electrode and a drain electrode.

Referring to FIGS. 7, 8 and 10, a first transistor TA1, a second transistor TA2, a third transistor TA3 and an eighteenth transistor TA18 are disposed on a SRCA stage. The first transistor TA1 is included in the pull-up part 230, and the second transistor TA2 is included in the pull-down part 260. The third transistor TA3 is included in the first maintaining part 281, and the eighteenth transistor TA18 is included in the second maintaining part 282.

The first transistor TA1 includes a gate electrode GA1, a source electrode SA1 and a drain electrode DA1, and the second transistor TA2 includes a gate electrode GA2, a source electrode SA2 and a drain electrode DA2. The third transistor TA3 includes a gate electrode GA3, a source electrode SA3 and a drain electrode DA3, and the eighteenth transistor TA18 includes a gate electrode GA18, a source electrode SA18 and a drain electrode DA18.

In an exemplary embodiment, the eighteenth transistor TA18 may be disposed between the first and second transistors TA1, TA2.

A node N signal IVTC of a SRCC stage that is one of previous stages of SRCA stage is applied to a gate electrode GA18 of the eighteenth transistor TA18 of a SRCA stage.

The gate electrode GA18 of the eighteenth transistor TA18 of the SRCA stage is connected to a gate electrode GC3 of a third transistor TC3 of SRCC stage corresponding to a previous stage of the SRCA stage. The gate electrode GA18 of the eighteenth transistor TA18 and a gate electrode GC3 of a third transistor TC3 of the SRCC stage are connected to each other at a node NC of the SRCC stage.

A first contact portion CA1 and a second contact portion CA2 for delivering a signal of a gate electrode GA1 of the first transistor TA1 to another element (e.g., a source electrode of a sixth transistor T6) may be disposed within the SRCA stage. The first contact portion CA1 delivers a signal of the gate electrode GA1 to the source metal layer from the gate metal layer. The second contact portion VA1 delivers a signal of the gate electrode GA1 to the gate metal layer from the source metal layer. The first contact portion CA1 and the second contact portion CA2 correspond to a node QA of a SRCA stage.

A first transistor TB1, a second transistor TB2, a third transistor TB3 and an eighteenth transistor TB18 are disposed on a SRCB stage.

In an exemplary embodiment, the eighteenth transistor TD18 may be disposed between the first and second transistors TB1, TB2.

A node N signal IVTD of SRCD stage that is one of previous stages of a SRCB stage is applied to a gate electrode GB18 of the eighteenth transistor TBA18 of a SRCB stage.

The gate electrode GB18 of the eighteenth transistor TB18 of the SRCB stage is connected to a gate electrode GD3 of a third stage TD3 of a SRCD stage corresponding to a previous stage of the SRCB stage. The gate electrode GB18 of the eighteenth transistor TB18 of the SRCB stage and the gate electrode GD3 of a third transistor TD3 of the SRCD stage are connected to each other at a node ND of the SRCD stage.

A first contact portion CB1 and a second contact portion CB2 for delivering a signal of a gate electrode GB1 of the first transistor TB1 to another element (e.g., a source electrode of a sixth transistor T6) may be disposed within the SRCB stage.

A first transistor TC1, a second transistor TC2, a third transistor TC3 and an eighteenth transistor TC18 are disposed on a SRCC stage.

In an exemplary embodiment, the eighteenth transistor TC18 may be disposed between the first and second transistors TC1, TC2.

A first contact portion CC1 and a second contact portion CC2 for delivering a signal of a gate electrode GB1 of the first transistor TC1 to another element (e.g., a source electrode of a sixth transistor T6) may be disposed within the SRCC stage.

A first transistor TD1, a second transistor TD2, a third transistor TD3 and an eighteenth transistor TD18 are disposed on a SRCD stage.

In an exemplary embodiment, the eighteenth transistor TD18 may be disposed between the first and second transistors TD1, TD2.

A first contact portion CD1 and a second contact portion CD2 for delivering a signal of a gate electrode GD1 of the first transistor TD1 to another element (e.g., a source electrode of a sixth transistor T6) may be disposed within the SRCD stage.

The gate drive circuit according to an exemplary embodiment includes a second maintaining part having a control terminal connected to a third output terminal OT3 of a previous stage, an input terminal connected to a gate output terminal Gn and an output terminal connected to a first voltage VSS1, such that the gate output terminal Gn may be maintained at a first voltage VSS1 in a low level interval of a first clock signal CKn during a gate output off interval Gout-off. Accordingly, the gate signal may be prevented from being floated to secure driving reliability of a display device. In addition, a display quality of the display device may be improved.

As described above, according to the present invention, the gate drive circuit includes a first maintaining part which maintains a gate signal at an off voltage in response to a high voltage of a clock signal inputted into a stage in a gate output off interval and a second maintaining part which maintains the gate signal at an off voltage during an interval that a low voltage of the clock signal is applied, so that it may prevent the gate signal from being floated such that driving reliability of a display device may be secured. In addition, a display quality of the display device may be improved.

Having described exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A gate drive circuit in which multiple stages are connected together one after each other, the stages configured to output a plurality of gate signals, an n-th stage, 'n' being a natural number, comprising:
   a pull-up part configured to output a high voltage of a first clock signal applied through a first clock terminal as a high voltage of an n-th gate signal;
   a carry part configured to output a high voltage of the first clock signal as a high voltage of an n-th carry signal;
   a pull-down part configured to pull-down the n-th gate signal into a first low voltage in response to a high voltage of a carry signal of an (n+1)-th stage;
   a switching part configured to output a first signal synchronized with the first clock signal during an interval other than a high voltage output interval of the n-th carry signal;
   a first maintaining part configured to maintain the n-th gate signal into the first low voltage in response to the first signal; and
   a second maintaining part configured to maintain the n-th gate signal into the first low voltage in response to a second signal having a phase different from that of the first signal,
   wherein the second signal is applied through a second clock terminal, the second signal being a second clock signal having a phase different from a phase of the first clock signal,
   wherein the first clock terminal of the n-th stage that receives the first clock signal is different from the second clock terminal of the n-th stage that receives the second clock signal, and
   wherein the second maintaining part comprises an eighteenth transistor having a control terminal connected to the second clock terminal, an input terminal configured to receive the n-th gate signal, and an output terminal configured to receive the first low voltage.

2. The gate drive circuit of claim 1, wherein the second signal has a phase opposite to the first signal.

3. The gate drive circuit of claim 1, wherein the pull-up part comprises a first transistor and the pull-down part comprises a second transistor, wherein the eighteenth transistor is disposed between the first transistor and the second transistor.

4. The gate drive circuit of claim 1, further comprising:
   a first connecting line connected to a control terminal of the eighteenth transistor of a first stage and the second clock terminal of a third stage; and
   a second connecting line connected to a control terminal of the eighteenth transistor of a second stage and the second clock terminal of a fourth stage,
   wherein the first connecting line and the second connecting line are disposed on a gate metal layer, and a number of points overlapped with the first connecting line and a source metal layer is substantially equal to a number of points overlapped with the second connecting line and the source metal layer.

5. The gate drive circuit of claim 1, wherein the second signal is a third signal outputted from a switching part of another stage different from the n-th stage.

6. The gate drive circuit of claim 5, wherein the third signal is a signal outputted from a switching part of an (n−1)-th stage.

7. The gate drive circuit of claim 5, wherein the second maintaining part comprises an eighteenth transistor having a control terminal connected to an output part of a switching part of the (n−1)-th stage, an input terminal configured to receive the n-th gate signal and an output terminal configured to receive the first low voltage.

8. The gate drive circuit of claim 7, wherein the pull-up part comprises a first transistor and the pull-down part comprises a second transistor, wherein the eighteenth transistor is disposed between the first transistor and the second transistor.

9. The gate drive circuit of claim 1, wherein the n-th stage further comprises a discharging part configured to discharge a voltage of a control terminal of the pull-up part into a second low voltage in response to an (n+1)-th carry signal outputted from a carry part of an (n+1)-th stage.

10. The gate drive circuit of claim 9, wherein the n-th stage further comprises:
    a third maintaining part configured to maintain a voltage of a control terminal of the pull-up part into the second low voltage in response to a first signal outputted from the switching part;
    a fourth maintaining part configured to maintain a voltage of a control terminal of the switching part into the second low voltage in response to an (n−1)-th carry signal outputted from a carry part of an (n−1)-th stage;
    a fifth maintaining part configured to maintain a voltage of a control terminal of the pull-up part into the second low voltage in response to an (n+2)-th carry signal outputted from a carry part of an (n+2)-th stage; and
    a sixth maintaining part configured to maintain a voltage of a carry part of the n-th stage into the second low voltage in response to the (n+1)-th carry signal.

11. A display device comprising: a display panel comprising
    a display area on which gate lines and source lines are formed and a peripheral area surrounding the display area;
    a source drive circuit configured to output data signals to the source lines; and
    a gate drive circuit integrated on the peripheral area, in which multiple stages are connected together one after each other, the stages configured to output a plurality of gate signals to the gate lines, an n-th stage, 'n' being a natural number, comprising:
        a pull-up part configured to output a high voltage of a first clock signal applied through a first clock terminal as a high voltage of an n-th gate signal;
        a carry part configured to output a high voltage of the first clock signal as a high voltage of an n-th carry signal;
        a pull-down part configured to pull-down the n-th gate signal into a first low voltage in response to a high voltage of a carry signal of an (n+1)-th stage;
        a switching part configured to output a first signal synchronized with the first clock signal during an interval except a high voltage output interval of the n-th carry signal;
        a first maintaining part configured to maintain the n-th gate signal at the first low voltage in response to the first signal; and
        a second maintaining part configured to maintain the n-th gate signal at the first low voltage in response to a second signal having a phase different from that of the first signal,
    wherein the second signal is applied through a second clock terminal, the second signal being a second clock signal having a phase different from a phase of the first clock signal,
    wherein the first clock terminal of the n-th stage that receives the first clock signal is different from the second clock terminal of the n-th stage that receives the second clock signal, and
    wherein the second maintaining part comprises an eighteenth transistor having a control terminal connected to the second clock terminal, an input terminal configured to receive the n-th gate signal, and an output terminal configured to receive the first low voltage.

12. The display device of claim 11, wherein the second signal has a phase opposite to the first signal.

13. The display device of claim 11, wherein the pull-up part comprises a first transistor and the pull-down part comprises a second transistor, wherein the eighteenth transistor is disposed between the first transistor and the second transistor.

14. The display device of claim 11, wherein the gate drive circuit further comprises:
    a first connecting line connected to a control terminal of the eighteenth transistor of a first stage and the second clock terminal of a third stage; and
    a second connecting line connected to a control terminal of the eighteenth transistor of a second stage and the second clock terminal of a fourth stage,
    wherein the first connecting line and the second connecting line are disposed on a gate metal layer, and a number of points overlapped with the first connecting line and a source metal layer is substantially equal to a number of points overlapped with the second connecting line and the source metal layer.

15. The display device of claim 11, wherein the second signal is a third signal outputted from a switching part of another stages different from the n-th stage.

16. The display device of claim 15, wherein the third signal is a signal outputted from a switching part of an (n−1)-th stage.

17. The display device of claim 15, wherein the second maintaining part comprises an eighteenth transistor having a control terminal connected to an output part of a switching part of the (n−1)-th stage, an input terminal configured to receive the n-th gate signal and an output terminal configured to receive the first low voltage.

18. The display device of claim 17, wherein the pull-up part comprises a first transistor and the pull-down part comprises a second transistor, wherein the eighteenth transistor is disposed between the first transistor and the second transistor.

19. The display device of claim 11, wherein the n-th stage further comprises a discharging part configured to discharge a voltage of a control terminal of the pull-up part into a second low voltage in response to an (n+1)-th carry signal outputted from a carry part of an (n+1)-th stage.

20. The display device of claim 19, wherein the n-th stage further comprises:
    a third maintaining part configured to maintain a voltage of a control terminal of the pull-up part into the second low voltage in response to a first signal outputted from the switching part;

a fourth maintaining part configured to maintain a voltage of a control terminal of the switching part into the second low voltage in response to an (n−1)-th carry signal outputted from a carry part of an (n−1)-th stage;

a fifth maintaining part configured to maintain a voltage of a control terminal of the pull-up part into the second low voltage in response to an (n+2)-th carry signal outputted from a carry part of an (n+2)-th stage; and a sixth maintaining part configured to maintain a voltage of a carry part of the n-th stage into the second low voltage in response to the (n+1)-th carry signal.

21. A gate drive circuit of a display device, the gate drive circuit comprising:

a first maintaining part configured to maintain a gate signal at an off voltage in response to a high voltage of a clock signal applied to the gate drive circuit during a gate output off interval; and a second maintaining part configured to maintain the gate signal at the off voltage in response to a low voltage of the clock signal applied to the gate drive circuit during the gate output off interval, wherein a first clock terminal of a n-th stage that receives the high voltage of the clock signal is different from a second clock terminal of the n-th stage that receives the low voltage of the clock signal, and wherein the second maintaining part comprises an eighteenth transistor having a control terminal connected to the second clock terminal, an input terminal configured to receive the n-th gate signal, and an output terminal configured to receive the first low voltage.

* * * * *